(12) United States Patent
Roldan et al.

(10) Patent No.: US 10,427,585 B2
(45) Date of Patent: Oct. 1, 2019

(54) ELECTRICAL POWER SUPPLY DEVICE FOR AT LEAST ONE LED AND AT LEAST ONE ELECTRONIC COMPONENT, COMPRISING A CIRCUIT FOR DRIVING THE ELECTRICAL POWER SUPPLY EQUIPPED WITH AN INSERT

(71) Applicant: VALEO ILUMINACION, Martos (ES)

(72) Inventors: Jose-David Roldan, Martos (ES); Miguel-Angel Pena, Martos (ES); Antonio Domingo Illan, Martos (ES)

(73) Assignee: VALEO ILUMINACION, Martos (ES)

( * ) Notice: Subject to any disclaimer, the term of this patent is extended or adjusted under 35 U.S.C. 154(b) by 0 days.

(21) Appl. No.: 15/941,461

(22) Filed: Mar. 30, 2018

(65) Prior Publication Data

US 2018/0281662 A1 Oct. 4, 2018

(30) Foreign Application Priority Data

Mar. 31, 2017 (FR) ..................... 17 52753

(51) Int. Cl.
*H05K 1/14* (2006.01)
*F21S 41/00* (2018.01)
(Continued)

(52) U.S. Cl.
CPC .......... *B60Q 1/0088* (2013.01); *F21S 41/148* (2018.01); *F21S 41/151* (2018.01);
(Continued)

(58) Field of Classification Search
CPC ....... B60Q 1/0088; F21S 45/48; H05K 1/181; H05K 1/0366; H05K 3/341; H05K 3/40;
(Continued)

(56) References Cited

U.S. PATENT DOCUMENTS 6,333,471 B1 * 12/2001 Nojioka ............... H01R 12/526
174/261
6,502,968 B1 * 1/2003 Simon .................. H05K 1/141
362/249.04
(Continued)

FOREIGN PATENT DOCUMENTS

DE 10 2011 101 805 A1 11/2012

OTHER PUBLICATIONS

French Preliminary Search Report dated Jan. 17, 2018 in French Application 17 52753 filed on Mar. 31, 2017 (with English Translation of Categories of Cited Documents).

*Primary Examiner* — Wei (Victor) Chan
*Assistant Examiner* — Henry Luong
(74) *Attorney, Agent, or Firm* — Oblon, McClelland, Maier & Neustadt, L.L.P.

(57) ABSTRACT

An electrical power supply device for at least one light source of the light emitting diode type and at least one electronic component, including a circuit for driving the electrical power supply of the light source or each light source, the drive circuit including at least one electrical conductor track and a housing for accommodating an insert, and an insert in an electrically conducting material, the insert being inserted in the accommodation housing and including a first end portion electrically connected to the conductor track, and a second end portion suited to being electrically connected to at least one electronic component so as to supply electrical power to the electronic component.

20 Claims, 4 Drawing Sheets

(51) Int. Cl.
  *B60Q 1/00* (2006.01)
  *H05K 3/40* (2006.01)
  *F21S 41/19* (2018.01)
  *F21S 41/148* (2018.01)
  *F21S 41/151* (2018.01)
  *F21S 45/48* (2018.01)
  *H05K 1/18* (2006.01)
  *H05K 3/34* (2006.01)
  *H01R 12/52* (2011.01)
  *F21S 45/47* (2018.01)
  *H05K 1/03* (2006.01)

(52) U.S. Cl.
  CPC ............ *F21S 41/192* (2018.01); *F21S 45/48* (2018.01); *H05K 1/181* (2013.01); *H05K 3/341* (2013.01); *H05K 3/4046* (2013.01); *F21S 45/47* (2018.01); *H01R 12/526* (2013.01); *H05K 1/0366* (2013.01); *H05K 3/3415* (2013.01); *H05K 2201/10106* (2013.01); *H05K 2201/10295* (2013.01); *H05K 2201/10416* (2013.01); *H05K 2201/10545* (2013.01); *H05K 2201/10962* (2013.01)

(58) Field of Classification Search
  CPC ........... H05K 3/34; H05K 2201/10106; H05K 2201/10295; H05K 2201/10416; H05K 2201/10545; H05K 2201/10962; H01R 12/52
  See application file for complete search history.

(56) References Cited

U.S. PATENT DOCUMENTS

| | | | |
|---|---|---|---|
| 6,747,217 B1 | 6/2004 | Jochym et al. | |
| 8,591,081 B2* | 11/2013 | Inaba | F21K 9/00 362/460 |
| 9,681,509 B2* | 6/2017 | Park | H01L 24/73 |
| 2005/0018446 A1* | 1/2005 | Ishida | F21V 5/04 362/545 |
| 2016/0281946 A1 | 9/2016 | Zojceski et al. | |
| 2016/0290589 A1 | 10/2016 | Redjem-Saad et al. | |
| 2016/0308101 A1* | 10/2016 | Konishi | H01L 33/60 |

* cited by examiner

ELECTRICAL POWER SUPPLY DEVICE FOR AT LEAST ONE LED AND AT LEAST ONE ELECTRONIC COMPONENT, COMPRISING A CIRCUIT FOR DRIVING THE ELECTRICAL POWER SUPPLY EQUIPPED WITH AN INSERT

The present invention relates to the field of electrical power supply devices for at least one light source and at least one electronic component. In particular, the present invention relates to an electrical power supply device comprising a circuit for driving the electrical power supply for the light source or each light source, the drive circuit comprising at least one electrical conductor track. In particular, but not exclusively, the light source or each light source can be a light emitting diode. The invention also targets a light source(s) support for light module and/or light-signaling module for motor vehicle comprising such an electrical power supply device; a light module for motor vehicle comprising such a light source(s) support; and a vehicle light device comprising such a light source(s) support and/or such a light module.

Electrical power supply devices for at least one light source and at least one electronic component are known that comprise a circuit for driving the electrical power supply of the light source or each light source. The drive circuit comprises at least one electrical conductor track. Such devices make it possible jointly to supply the light source and the electronic component with electrical current.

The electronic component can be for example another light source, for example of the light emitting diode type, but also any other type of electronic component.

When the light source and the electronic component are arranged on either side of a third component, such as for example a heat dissipater, as is the case for example in a light module for dual beam motor vehicle, the problem arises regarding the efficiency of the electrical power supply for the light source and the electronic component, as well as that of the space requirement of the electrical power supply means.

In order to respond to this double problem, the provision is known of a circuit for driving the power supply, folded beforehand, such that it can be fastened on either side of the third component. For example, when the third component is a heat dissipation substrate having two opposite sides, the drive circuit, folded beforehand, is fastened on each opposite side of the heat dissipater, so as to have at least one electrical conductor track on either side of the substrate. The light source and the electronic component, respectively fastened for example on each opposite side of the substrate, are then electrically connected to the drive circuit, more precisely to the conductor track or to one of the conductor tracks of the drive circuit.

A disadvantage of such an electrical power supply device is that the drive circuit, folded beforehand, is relatively costly and not very reliable. In effect, the ratio of useful area to total volume of the drive circuit is relatively low, which leads to substantial extra costs. Furthermore, folding the drive circuit requires prior machining, which again leads to additional costs. Finally, significant risks of breakage exist at the folding lines of the drive circuit.

The technical problem the invention aims to resolve is therefore to propose an electrical power supply device for at least one light source and at least one electronic component that is suitable for jointly supplying the light source and the electronic component with electrical current when they are arranged on either side of a third component, and that has a reduced space requirement and costs and improved reliability.

To this effect, a first object of the invention is an electrical power supply device for at least one light source of the light emitting diode type and at least one electronic component, comprising:
  a circuit for driving the electrical power supply for the light source or each light source, the drive circuit comprising at least one electrical conductor track and a housing for accommodating an insert;
  an insert in an electrically conducting material, said insert being inserted in the accommodation housing and comprising a first end portion electrically connected to the conductor track, and a second end portion suited to being electrically connected to at least one electronic component so as to supply electrical power to said electronic component.

Thus, thanks to the presence of the electrical conductor insert accommodated in the accommodation housing of the drive circuit and electrically connected to the conductor track, a point of access to an electrical power supply is obtained towards the face opposite the face of the drive circuit supporting the conductor track. No folding of the drive circuit is then necessary, which drastically reduces the risks of breakage. Furthermore, a lower cost drive circuit can advantageously be used. A reliable, affordable and space-saving solution is therefore obtained for the joint electrical power supply for the light source and the electronic component.

The electrical power supply device according to the invention can optionally have one or more of the following characteristics:
  the drive circuit comprises a first face, a second face opposite the first face and an opening connecting the first and second faces and forming said accommodation housing, the electrical conductor track being arranged on the first face; the insert extending through the opening;
  the first end portion of the insert comes out towards the first face, and the second end portion comes out towards the second face, the second end portion being suited to being electrically connected to at least one electronic component extending towards the second face so as to supply electrical power to said electronic component;
  the first end portion of the insert is fastened by soldering to the first face of the drive circuit;
  the insert is composed of at least one branch having a T shape;
  the first end portion forms the shorter bar of the T shaped branch or each T shaped branch, and extends on the first face of the drive circuit;
  the first end portion is in copper, tin or aluminum; or in an alloy comprising at least two materials among copper, tin and aluminum;
  the second end portion forms the free end of the longer bar of the T shaped branch or each T shaped branch;
  advantageously, the second end portion is in nickel, nickel-gold or nickel-palladium alloy; these materials in effect making it possible to carry out soldering for electrical connection by wire bonding; it is advantageously carried out in the form of cladding on the body of the insert;
  the insert is a mechanical part held by friction in the accommodation housing of the drive circuit;

the outer face of the first end portion is flush with the first face of the drive circuit;

the insert is obtained by molding an electrically conducting material in the accommodation housing of the drive circuit;

the body of the insert is preferably made in aluminum; it can be copper, tin or aluminum; or in an alloy comprising at least two materials among copper, tin and aluminum;

the insert is composed of two distinct branches connected to each other;

the second end portion of the insert has a cylindrical cross-section, in particular, a circular or rectangular cross-section;

the drive circuit of the power supply is printed on or in a printed circuit in electrically insulating material;

the drive circuit comprises a board on which the electrical conductor track is assembled, preferably a board in thermoset resin reinforced with solid fibers.

A further object of the invention is a light source(s) support for light module and/or light-signaling module for motor vehicle comprising:

a substrate in heat conducting material, the substrate comprising two opposite faces and an orifice connecting the two faces;

at least one light source of the light emitting diode type assembled on a first face of the substrate;

at least one electronic component assembled on a second face of the substrate, opposite the first face;

a power supply device for the light source or each light source and for the electronic component or each electronic component, as described above;

the drive circuit of the device being arranged on the first face of the substrate such that the accommodation housing for the drive circuit extends facing the orifice, the insert of the device extending through the orifice, the light source or each light source being connected to the conductor track or one of the conductor tracks of the drive circuit, the electronic component or each electronic component being connected to the second end portion of the insert.

According to an embodiment example, the electronic component or each electronic component is a module for driving the current inside the light source or one of the light sources.

According to another embodiment example, the electronic component or each electronic component is a light source of the light emitting diode type.

The light source(s) support according to the invention can optionally have one or more of the following characteristics:

the light source or each light source is bonded or soldered on the first face of the substrate;

the drive circuit for the power supply comprises an edge facing the light source or one of the light sources;

the light source or each light source is bonded or soldered on the drive circuit;

the light source or each light source is connected to the conductor track or one of the conductor tracks of the drive circuit by means of surface-soldered metal wires;

the electronic component or each electronic component is connected to the second end portion of the insert by means of surface-soldered metal wires;

the metal wires extend in an aerial manner, preferably with loop profiles, distanced from the respective outer surfaces of the drive circuit for the power supply and for the light source(s);

the substrate comprises cooling fins;

the substrate comprises a first portion forming a wall supporting the light source(s) and a second portion comprising cooling fins;

the second portion is disposed substantially in the alignment of the first portion;

the first and second portions of the substrate are integrally formed;

the substrate and the drive circuit form a single component of the insulated metal substrate type;

the substrate is in aluminum.

A further object of the invention is a light module for motor vehicle, comprising:

a light source(s) support as described above;

at least one optical device able to transmit the light rays emitted by the light source or at least one of the light sources as a lighting beam.

The light module according to the invention can optionally have one or more of the following characteristics:

the module comprises a first optical device disposed facing the first face of the substrate, and a second optical device disposed facing the second face of the substrate;

the substrate comprises cooling fins disposed rearwards of the optical device(s) relative to the main direction of emission of the lighting beam.

A further object of the invention is a light source(s) support as described above and/or a light module as described above.

In a particular embodiment of the invention, the vehicle light device according to the invention is a device for lighting the road, in particular a projector.

A further object of the invention is a vehicle comprising at least one vehicle light device as described above.

Other characteristics and advantages of the invention will emerge on reading the detailed description of the non-limitative examples that follow, for whose understanding reference shall be made to the attached drawings, among which:

Figure 1:
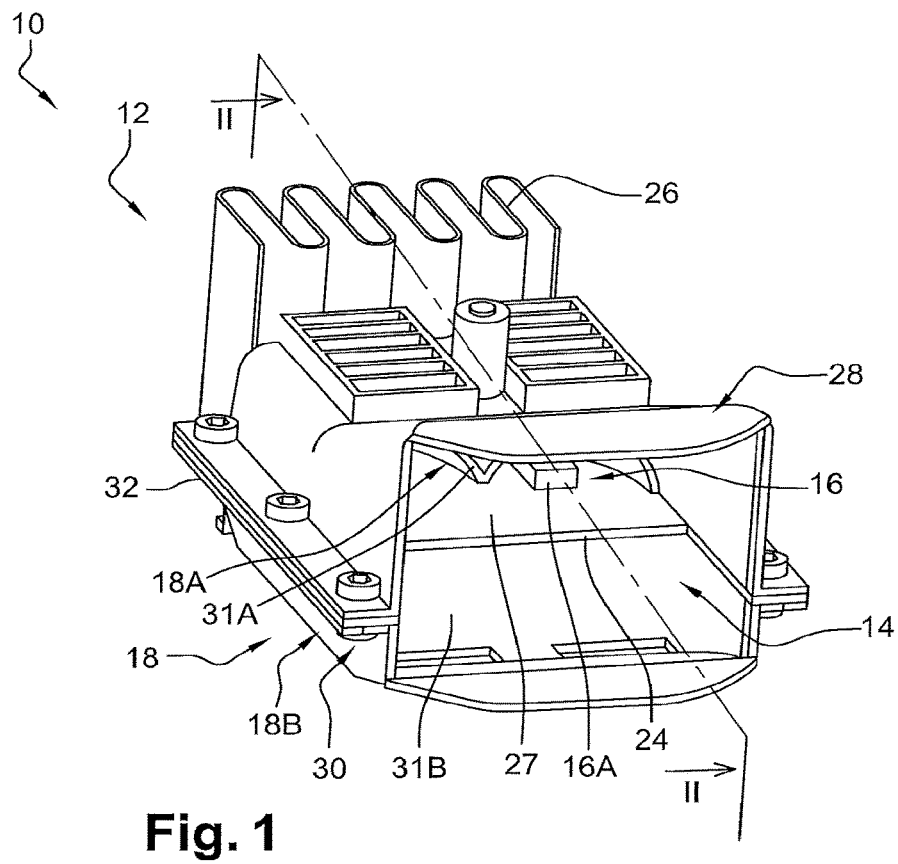
FIG. 1 is a perspective view of a vehicle light device equipped with a light module, the light module comprising a light sources support, the support including two light sources and an electrical power supply device for the light sources according to the invention.
Figure 2:
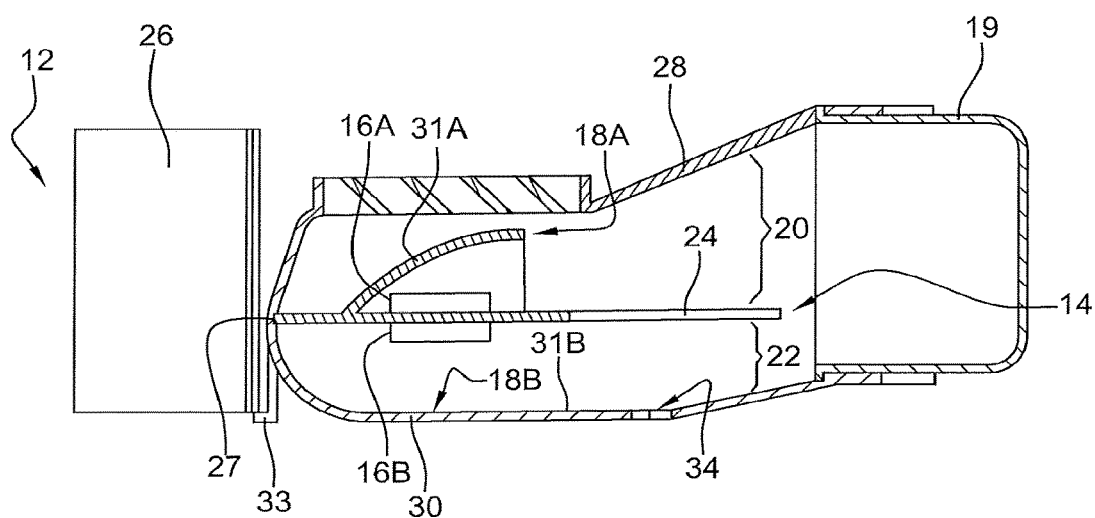
FIG. 2 is a sectional view, taken along a plane II-II, of the light module of FIG. 1.

FIGS. 1 and 2 illustrate a vehicle light device 10. The light device 10 is a lighting or signaling device of any type, capable of lighting or signaling the presence of an object or a physical entity. In the particular embodiment example of FIGS. 1 and 2, the light device 10 is a device for lighting the road, in particular a projector. As a variant, not illustrated, the light device 10 is a signaling light of a vehicle, or a light-signaling module arranged on or inside a vehicle. The vehicle light device 10 comprises for example a light module 12, as illustrated on FIGS. 1 and 2.

The vehicle light module 12 comprises a support 14 for light source(s) 16, and at least one optical device capable of transmitting light rays emitted by the light source(s) 16 as a lighting beam. The light module 12 preferably furthermore includes an optical projection device 19.

In the particular embodiment example of FIGS. 1 and 2, the support 14 comprises two light sources 16A, 16B and the light module 12 comprises two optical devices 18A, 18B. According to this particular embodiment example, the light module 12 is composed of two sub-modules 20, 22, mounted one against the other.

The two sub-modules 20, 22 are disposed one below the other, on either side of a central supporting substrate 24, which will be described subsequently. In the preferred embodiment example illustrated on FIGS. 1 and 2, the substrate 24 supports at one end fins 26 for cooling by heat exchange. Such cooling fins 26 form, jointly with the substrate 24, a heat dissipater. The cooling fins 26 are disposed towards the rear of the optical devices 18A, 18B. "Towards the rear of the optical devices" means in the direction opposite the main direction of emission of the lighting beam.

In the preferred embodiment example illustrated on FIGS. 1 and 2, the substrate 24 comprises a first portion 27 and a second portion 33. The first portion 27 forms a wall supporting the light sources 16A, 16B. The second portion 33 comprises the cooling fins 26. Preferably, as illustrated on FIG. 2, the first and second portions 27, 33 are integrally formed.

Each sub-module 20, 22 includes a half shell 28, 30, which is fastened to the substrate 24. Each light source 16A, 16B is disposed on the face of the substrate 24 that is turned towards the corresponding half shell 28, 30 so as to be capable of emitting light rays towards this half shell.

Each optical device 18A, 18B is composed for example of an optical deviation element 31A, 31B, and is disposed facing the face of the substrate 24 that is turned towards the corresponding half shell 28, 30.

The optical projection device 19 is supported by the free ends of the half shells 28, 30, the assembly being arranged such that for each sub-module 20, 22, the rays emitted by the light sources 18A, 18B are reflected by the associated optical device 18A, 18B, in the direction of the optical projection device 19. The optical projection device 19 here is a projection lens.

In the following, the half shells will be described according to the orientation of the light module 12 illustrated in particular on FIG. 1, in which module a second half shell 28 is disposed above a first half shell 30, such that for the example that will follow, the notions of first half shell and lower half shell will be assimilated, as well as those of second half shell and upper half shell.

The first half shell 30 or lower half shell is made for example in a polycarbonate type of plastic material, and it includes at its periphery a frame 32 for fastening to the substrate 24, and at its center a curved wall having a substantially ellipsoid profile, not visible on the figures. The first half shell 30 accommodates inside the dome, formed in this way between the half shell and the substrate 24, a light source 16B composed of a light emitting diode mounted below the substrate 24. It is understood that if the first half shell 30 has a double ellipsoid profile, two specific light sources 16B will be provided so that each ellipsoid is specifically lit by the diode of one of the sources.

The optical deviation element 31B is obtained directly by a portion of the inner surface 34 of the first half shell 30. A specific coating of the inner surface 34 is made in a reflecting material, over all or part of the first half shell 30.

The light source 16B and the optical deviation element 31B are arranged such that the rays emitted by the source 16B are deviated by the reflecting surface in the direction of the optical projection device 19, so as to form a light beam of the high beam type.

The second half shell 28 or upper half shell is made for example in a polycarbonate type of plastic material. The second half shell 28 is part of an upper sub-module 20 capable of generating as output a beam of the low beam type.

In the embodiment described, the optical deviation element 31A is made independently of the second half shell 28. This half shell is fastened to the substrate so as to cover the optical deviation element 31A composed of a reflector also fastened on the substrate 24.

The reflector 31A has an inner face whose coating is capable of reflecting the light emitted by the light source 16A, which it faces. The light source 16A is composed for example of a light emitting diode mounted on the substrate 24. As illustrated, the reflector 31A can be double, that is to say it can have a shape with several ellipses, and in this case, a specific light source 16A is provided for each elliptical shape of the reflector 31A.

The rays emitted by the light source 16A are reflected by the reflector 31A in the direction of the optical projection device 19, and a shield is arranged on the trajectory of the rays such that the beam is cut and the light as output forms low beams that are not dazzling for the other users.

As a variant, not illustrated, it is possible to envisage that the second half shell 28 is made substantially like the first half shell 30, with a single piece which acts as shell and as reflecting surface by treating its inner surface.

The light emitting diodes forming the light sources 16A, 16B are advantageously power diodes assembled on a base in ceramic material. They are lacking a metal plate towards the assembly face of the base. These light emitting diodes therefore consist of a light emitting semi-conductor component placed on the base, with means for enabling electrical power to be supplied to the semi-conductor component, such as gold microbeads, a layer of gold solder or a gold wire. These light emitting diodes on ceramic base allow better management of thermal stresses and above all an increased positioning precision vis-à-vis an optical device 18A, 18B intended to transmit the light emitted by these diodes, compared with other types of packaging of light emitting diodes, which take more space and have a base with a more extended surface area, usually including a metal plate, generally in copper or aluminum, towards the face in contact with the support.

The support 14 comprises the substrate 24, at least one light source 16A and at least one electronic component. The support 14 furthermore comprises an electrical power supply device for the light source or each light source 16A and for the electronic component or each electronic component.

The support 14 of light source(s) according to a first embodiment example will now be described in more detail, with reference to FIGS. 3 to 5.

The support 14 comprises a single light source 16A, a single electronic component, and an electrical power supply device 40 according to a first embodiment of the invention.

The substrate 24 is in heat conducting material, for example in aluminum. The substrate 24 comprises two opposite faces 42A, 42B; and an orifice 44 connecting the two faces 42A, 42B.

As indicated previously, the light source 16A is composed of a light emitting diode and is assembled on a first face 42A of the substrate 24.

The electronic component is assembled on a second face 42B of the substrate 24, opposite the first face 42A. The electronic component is preferably fastened directly on the second face 42B of the substrate 24, for example by bonding or by soldering. In the particular embodiment example of FIGS. 3 to 5, the electronic component is the light source 16B, composed of a light emitting diode.

The electrical power supply device 40 comprises a circuit 46 for driving the electrical power supply for the light source 16A, and an insert 48.

The drive circuit 46 comprises a housing 50 for accommodating the insert 48, and at least one electrical conductor track, not illustrated on the figures for reasons of clarity. The drive circuit 46 is preferably printed on a printed circuit in electrically insulating material. As a variant, the drive circuit 46 is printed in such a printed circuit. Preferably again, the drive circuit 46 comprises a board on which the electrical conductor track is assembled. The board is preferably a board in thermoset resin reinforced with solid fibers.

Figure 5:
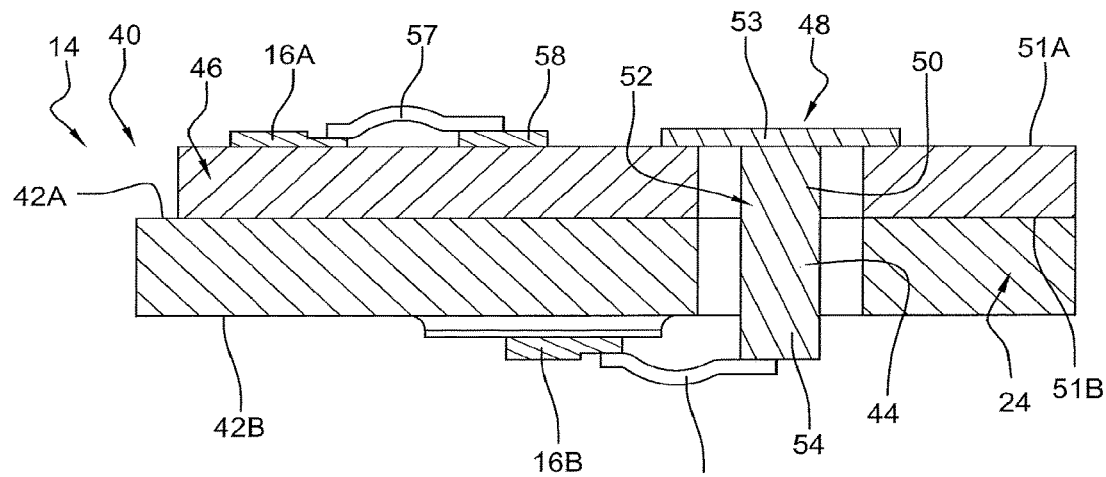
FIG. 5 is a sectional view, taken along a plane V-V, of the light sources support of FIG. 3.

The drive circuit 46 is arranged on the first face 42A of the substrate 24 such that the accommodation housing 50 extends facing the orifice 44, as illustrated on FIG. 5.

Figure 3:
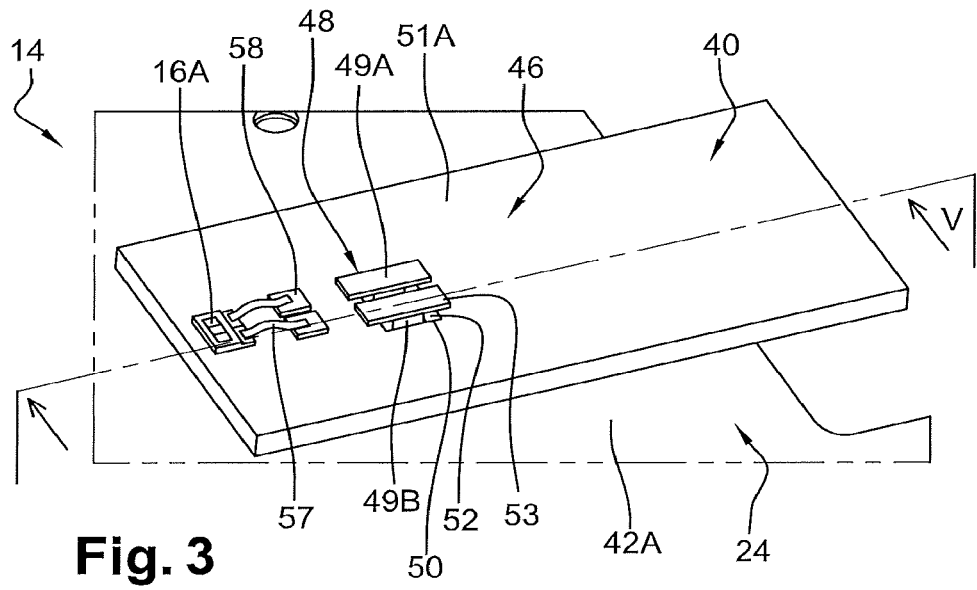
FIG. 3 is a perspective view of the top of the light sources support of FIG. 1 according to a first embodiment example, the support comprising an electrical power supply device according to a first embodiment of the invention.
Figure 4:
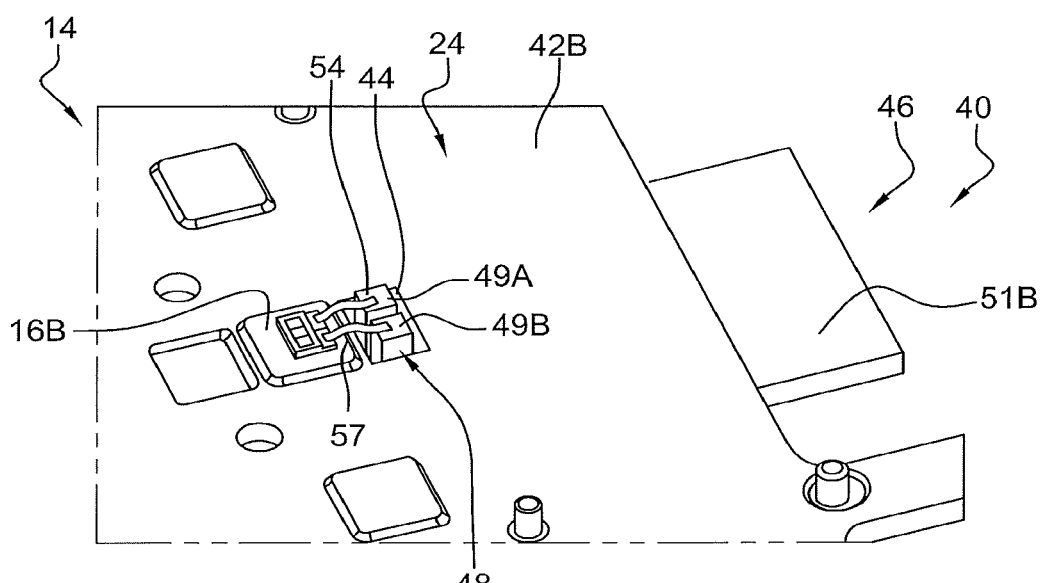
FIG. 4 is a perspective view of the underside of the light sources support of FIG. 3.

According to the particular embodiment of the power supply device 40 illustrated on FIGS. 3 to 5, the drive circuit 46 comprises a first face 51A, a second face 51B opposite the first face 51A, and an opening 52 connecting the first and second faces 51A, 51B from one side to the other. The electrical conductor track of the drive circuit 46 is arranged on the first face 51A. The opening 52 forms the housing 50 for accommodating the insert 48, as illustrated on FIG. 5.

The insert 48 is in electrically conducting material. The insert 48 is inserted in the accommodation housing 50 and extends through the orifice 44, as illustrated on FIGS. 3 to 5. The insert 48 comprises a first end portion 53 and a second end portion 54. The insert 48 is composed for example of at least one branch 49A, 49B having a T shape. Preferably, as illustrated on FIGS. 3 and 4, the insert 48 is composed of two distinct branches 49A, 49B, connected to each other and each having for example a T shape.

According to the particular embodiment of the power supply device 40 illustrated on FIGS. 3 to 5, the insert 48 furthermore extends through the opening 52. More precisely, according to this particular embodiment, the first end portion 53 of the insert 48 comes out towards the first face 51A of the drive circuit 46, and the second end portion 54 comes out towards the second face 51B. The first end portion 53 of the insert 48 extends for example on the first face 51A of the drive circuit 46, as illustrated on FIS. 3 and 5. In this case, the first end portion 53 is fastened for example by soldering on the first face 51A of the drive circuit 46. As an embodiment variant, not illustrated, the outer face of the first end portion 53 of the insert 48 is flush with the first face 51A of the drive circuit 46. According to this variant, the insert 48 is a mechanical part held by friction in the accommodation housing 50. This variant makes it possible to reduce the manufacturing costs of the insert 48.

When the insert 48 is composed for example of at least one branch 49A, 49B having a T shape, the first end portion 53 forms for example the shorter bar of the T shaped branch or each T shaped branch 49A, 49B as illustrated on FIGS. 3 and 5. The second end portion 54 then forms the free end of the longer bar of the T shaped branch or each T shaped branch 49A, 49B. The first end portion 53 is in copper for example. As a variant, the first end portion 53 is in tin or aluminum; or in an alloy comprising at least two materials among copper, tin and aluminum. The second end portion 54 is advantageously in nickel, nickel-gold or nickel-palladium alloy; it is advantageously made as cladding on the body of the insert.

The first end portion 53 is electrically connected to the conductor track or one of the conductor tracks of the drive circuit 46, for example by direct electrical contact.

The second end portion 54 is connected to the electronic component 16B so as to supply electrical power to the component 16B, as illustrated on FIGS. 4 and 5. Preferably, as illustrated on these figures, the electronic component 16B is connected to the second end portion 54 by means of metal wires 57, numbering two for example, surface-soldered on the insert 48. Preferably again, the metal wires 57 have loop profiles and extend in an aerial manner, distanced from the outer surface of the drive circuit 46. These wires 57 are soldered to the second end portion 54 of the insert 48, and to the corresponding zones of the electronic component 16B, in particular by ultrasound. This is the technology known as "wire bonding", or by the term "wiring by wire" or "bridging". Wiring is simply carried out with a wire (or bridge) soldered between the two elements to be bridged. The soldering is generally done by ultrasound. The material of the wire is aluminum, gold or copper or a combination of these materials. One or more wires can be used for each connection. As a variant, not illustrated, the metal wires 57 are replaced by metal braids or metal strips, surface-soldered.

Preferably, the second end portion 54 has a cylindrical cross-section. In the embodiment example of FIGS. 3 to 5, the second end portion 54 has a rectangular cross-section. More precisely, according to this particular embodiment example, each portion of T shaped branch 49A, 49B that forms part of the second end portion 54 has a rectangular cross-section. As a variant, not illustrated, the second end portion 54 has a circular cross-section.

In the particular embodiment example of FIGS. 3 to 5, the light source 16A is fastened directly to the drive circuit 46, for example by bonding or soldering. The light source 16A is connected to the conductor track or one of the conductor tracks of the drive circuit 46. Preferably, as illustrated on FIGS. 3 and 5, the light source 16A is connected to the conductor track or one of the conductor tracks of the drive circuit 46 by means of metal wires 57, numbering two for example, soldered to the surface of the circuit 46 via metal connection pads 58. The metal wires 57 are advantageously soldered to the connection pads 58 and to the corresponding zones of the light source 16A via a "wire-bonding" or "bridging" technology as described above. The metal wires 57 preferably have loop profiles and extend in an aerial manner, distanced from the outer surface of the drive circuit 46. As a variant, not illustrated, the metal wires 57 are replaced by metal braids or metal strips, surface-soldered.

The technology of connection by wire bonding with metal wires soldered, preferably by ultrasound but also by laser soldering or resistive soldering, makes it possible subsequently to make electrical connections in a manner that is simple, reliable, affordable and compatible with the fastening by adhesive or by soldering of the light sources or electronic components.

Figure 6:
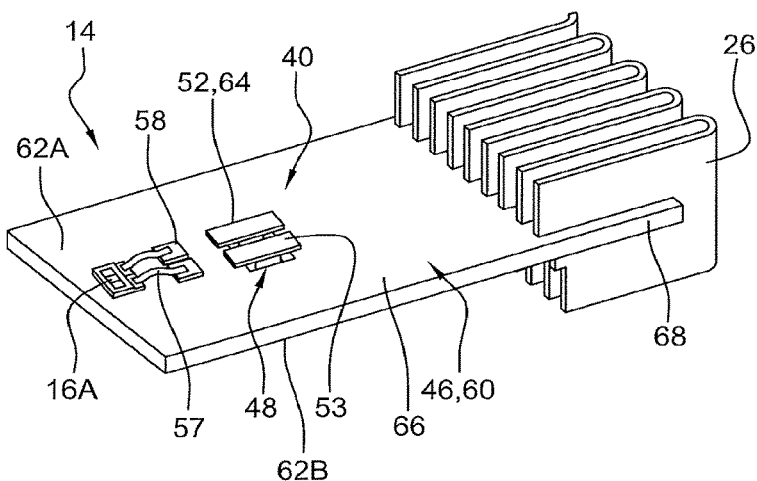
FIG. 6 is a perspective view of the top of the light sources support of FIG. 1 according to a second embodiment example.

The light source(s) support 14 according to a second embodiment example will now be described with reference to FIG. 6. Elements similar to the first embodiment example, previously described with reference to FIGS. 3 to 5, are identified by identical reference numbers, and are therefore not described again.

The support 14 comprises the light source 16A, the electronic component and the electrical power supply device 40 according to the first embodiment of the invention. The support 14 furthermore comprises a substrate 60.

The substrate 60 is in heat conducting material. The substrate 60 comprises two opposite faces 62A, 62B; and an orifice 64 connecting the two faces 62A, 62B.

The substrate 60 furthermore comprises a first portion 66 and a second portion 68. The first portion 66 forms a wall supporting the light source 16A. The second portion 68 comprises cooling fins 26. Preferably, as illustrated on FIG. 6, the second portion 68 is disposed substantially in the alignment of the first portion 66. Preferably again, the first and second portions 66, 68 are integrally formed.

In the light source(s) support 14 according to the second embodiment example of the invention, the substrate 60 and the drive circuit 46 form a single component of the insulated metal substrate type. This way, according to this embodiment example, the orifice and the opening 52 are merged, as illustrated on FIG. 6.

The light source(s) support 14 according to a third embodiment example will now be described with reference to FIGS. 7 to 9. Elements similar to the first embodiment example, previously described with reference to FIGS. 3 to 5, are identified by identical reference numbers, and are therefore not described again.

The support 14 comprises the light source 16A, the electronic component and a device 71 for supplying electrical power to the light source 16A and the electronic component according to a second embodiment of the invention. The support 14 furthermore comprises a substrate 72.

Figure 7:
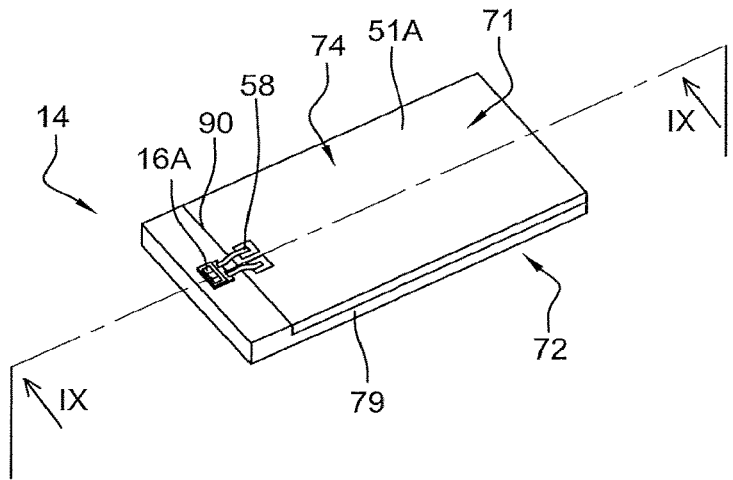
FIG. 7 is a perspective view of the top of the light sources support of FIG. 1 according to a third embodiment example, the support comprising an electrical power supply device according to a second embodiment of the invention.
Figure 8:
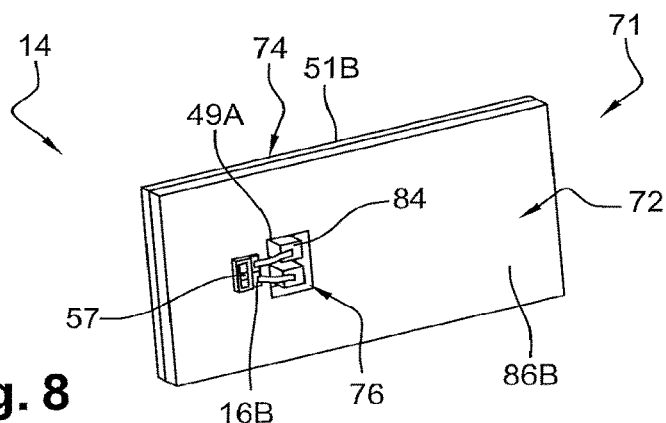
FIG. 8 is a perspective view of the underside of the light sources support of FIG. 7.
Figure 9:
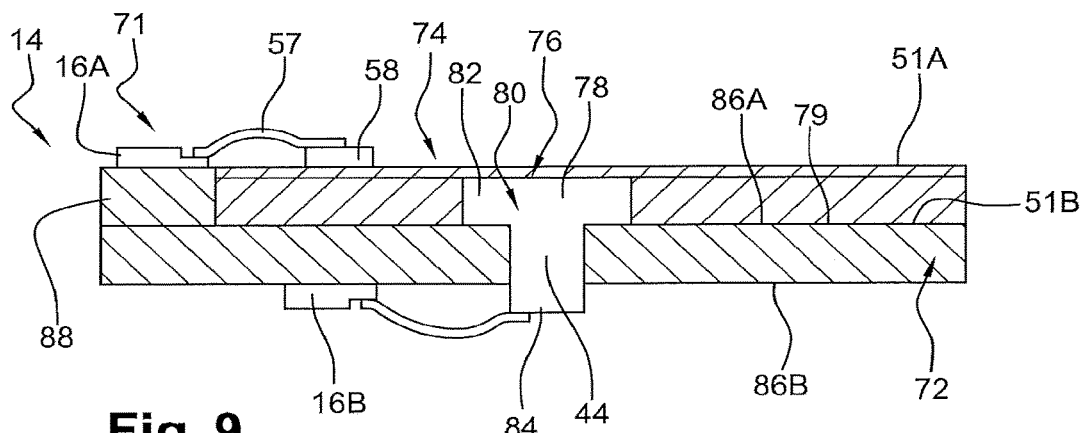
FIG. 9 is a sectional view, taken along a plane IX-IX, of the light sources support of FIG. 7.

In the particular embodiment example of FIGS. 7 to 9, the electronic component is the light source 16B, composed of a light emitting diode.

The electrical power supply device 71 comprises a circuit 74 for driving the electrical power supply for the light source 16A, and an insert 76.

The drive circuit 74 comprises a housing 78 for accommodating the insert 76, illustrated on FIG. 9, and at least one electrical conductor track, not illustrated on the figures for reasons of clarity. The drive circuit 74 is preferably printed on a printed circuit in electrically insulating material. As a variant, the drive circuit 74 is printed in such a printed circuit. Preferably again, the drive circuit 74 comprises a board on which the electrical conductor track is assembled. The board is preferably a board in thermoset resin reinforced with solid fibers.

The drive circuit 74 is arranged in a recess 79 made in one of the faces of the substrate 72 as described subsequently. The accommodation housing 78 therefore extends facing the orifice 44, as illustrated on FIG. 9.

According to the particular embodiment of the power supply device 71 illustrated on FIGS. 7 to 9, the drive circuit 74 comprises a first face 51A, and a second face 51B opposite the first face 51A, and a blind hole 80 provided in the second face 51B. The electrical conductor track of the drive circuit 74 is arranged on the first face 51A. The blind hole 80 forms the housing 78 for accommodating the insert 76. The insert 76 is in electrically conducting material and extends through the orifice 44 of the substrate 72 connecting the two opposite faces of the substrate 72, as illustrated on FIG. 9 and as described subsequently. The insert 76 comprises a first end portion 82 and a second end portion 84. The insert 76 is composed for example of at least one branch 49A, 49B having a T shape. Preferably, as illustrated on FIG. 8, the insert 76 is composed of two distinct branches 49A, 49B, connected to each other and each having for example a T shape.

According to the particular embodiment of the power supply device 71 illustrated on FIGS. 7 to 9, the insert 76 is a mechanical part held by friction in the accommodation housing 78, as illustrated on FIG. 9. The body of the insert 76 is preferably obtained by molding an electrically conducting material, for example aluminum, in the accommodation housing 78.

According to this particular embodiment of FIGS. 7 to 9, the first end portion 82 of the insert 48 is in electrical contact with the electrical conductor track or one of the electrical conductor tracks of the drive circuit 74. In the illustrative example of FIG. 9, the first end portion 82 of the insert 48 is in direct electrical contact with the electrical conductor track or one of the electrical conductor tracks provided in the first face 51A of the drive circuit 74. As a variant, not illustrated, the first end portion 82 can be electrically connected to the electrical conductor track or one of the electrical conductor tracks of the drive circuit 74 via electrical connections internal to the circuit or via a connector deformable under pressure. The second end portion 84 comes out towards the second face 51B of the drive circuit 74.

The second end portion 84 is connected to the electronic component 16B, for the electrical power supply of the component 16B, as illustrated in FIGS. 8 and 9.

The substrate 72 is in heat conducting material, for example in aluminum. The substrate 72 comprises two opposite faces 86A, 86B; and an orifice 44 connecting the two faces 86A, 86B.

The light source 16A is composed of a light emitting diode and is assembled on a first face 86A of the substrate 72. In the particular embodiment example of FIGS. 7 to 9, the light source 16A is fastened directly on this first face 86A of the substrate 72, for example by bonding or by soldering. The light source 16A is fastened for example to a lateral rim 88 of the first face 86A of the substrate 72.

The electronic component 16B is assembled on a second face 86B of the substrate 72, opposite the first face 86A. The electronic component 16B is preferably fastened directly on the second face 86B of the substrate 72, for example by bonding or soldering.

The substrate 72 defines on its first face 86A a lateral rim 88 for supporting the light source 16A, and a recess 79. The recess 79 extends laterally along the lateral rim 88, and longitudinally along the main direction of emission of the light beam. As illustrated on FIGS. 7 and 9, the drive circuit 74 is accommodated in the recess 79, such that the first face 51A of the drive circuit 74 is flush with the upper face of the lateral rim 88. A lateral edge 90 of the first face 51A of the drive circuit 74 therefore extends facing the light source 16A, as illustrated on FIG. 7.

The power supply device 71 according to the particular embodiment illustrated on FIGS. 7 to 9 makes it possible to reduce the size of the insert 76. The manufacturing costs of the insert 76 are therefore advantageously reduced.

According to an embodiment, not illustrated on the figures, the vehicle light device 10 does not include a light module 12, but comprises the light source(s) support 14. According to this embodiment, the light source(s) support 14 is for example a signaling light support for motor vehicle, and the light device 10 is for example a signaling light of a vehicle, or a light-signaling module arranged on or inside the vehicle.

Furthermore, although the invention has been described with reference to a light source(s) support 14 comprising an electronic component 16B of the light emitting diode type, it will of course be understood that the invention is not limited to this type of electronic component, but also applies to any type of electronic component capable of being powered by an electrical current, for example a module for driving the current circulating inside the light source 16A.

The invention claimed is:

1. Electrical power supply device for at least one light source of a light emitting diode type and at least one electronic component, comprising:
    a circuit for driving the electrical power supply of the at least one light source, the circuit comprising at least one electrical conductor track and a housing for accommodating an insert; and
    the insert in an electrically conducting material, said insert being inserted in the housing and comprising a first end portion electrically connected to the at least one electrical conductor track, and a second end portion suited to being electrically connected to at least one electronic component so as to supply electrical power to the at least one electronic component,
    wherein the first end portion is in a material different from the second end portion.

2. The electrical power supply device according to claim 1, wherein the drive circuit comprises a first face, a second face opposite the first face and an opening connecting the first and second faces and forming said housing, the at least one electrical conductor track being arranged on the first face; the insert extending through the opening.

3. The electrical power supply device according to claim 2, wherein the first end portion of the insert comes out towards the first face, and the second end portion comes out towards the second face, the second end portion being suited to being electrically connected to the at least one electronic component extending towards the second face so as to supply electrical power to said at least one electronic component.

4. The electrical power supply device according to claim 2, wherein the first end portion of the insert is fastened by soldering to the first face of the drive circuit.

5. The electrical power supply device according to claim 1, wherein the insert is composed of at least one branch having a T shape.

6. The electrical power supply device according to claim 5, wherein the first end portion forms a shorter bar of a T shaped branch, and extends on the first face of the drive circuit.

7. The electrical power supply device according to claim 6, wherein the first end portion is in copper, tin or aluminum; or in an alloy comprising at least two materials among copper, tin and aluminum.

8. The electrical power supply device according to claim 5, wherein the second end portion forms a free end of a longer bar of the T shaped branch.

9. The electrical power supply device according to claim 8, wherein the second end portion is in nickel, nickel-gold or nickel-palladium alloy.

10. The electrical power supply device according to claim 1, wherein the insert is a mechanical part held by friction in the housing of the drive circuit.

11. Light source(s) support for light module and/or light-signaling module for motor vehicle comprising:
    a substrate in heat conducting material, the substrate comprising two opposite faces and an orifice connecting the two opposite faces;
    the at least one light source of the light emitting diode type assembled on a first face of the substrate;
    the at least one electronic component assembled on a second face of the substrate, opposite the first face; and
    the power supply device for the light source and for the at least one electronic component;
    wherein the electrical power supply device conforms to claim 1, wherein the drive circuit of the electrical power supply device being arranged on the first face of the substrate such that the housing for the drive circuit extends facing the orifice, the insert of the device extending through the orifice, the light source being connected to the at least one electrical conductor track of the drive circuit, the at least one electronic component being connected to the second end portion of the insert.

12. The light source(s) support according to claim 11, wherein the at least one electronic component is a module for driving a current inside the at least one light source.

13. The light source(s) support according to claim 11, wherein the at least one electronic component is the light source of the light emitting diode type.

14. The light source(s) support according to claim 11, wherein the at least one light source is bonded or soldered on the first face of the substrate.

15. The light source(s) support according to claim 11, wherein the electrical power supply device, and wherein the substrate and the drive circuit form a single component of an insulated metal substrate type.

16. A light module for motor vehicle, comprising:
    light source(s) support;
    at least one optical device able to transmit light rays emitted by the light source as a lighting beam;
    wherein the light source(s) support conforms to claim 11.

17. The light module according to claim 16, wherein the light module comprises a first optical device disposed facing the first face of the substrate, and a second optical device disposed facing the second face of the substrate.

18. The light module according to claim 16, wherein the substrate comprises cooling fins disposed rearwards of the at least one optical device relative to a main direction of emission of the lighting beam.

19. Vehicle light device comprising the light source(s) support according to claim 11 and/or the light module.

20. The electrical power supply device according to claim 3, wherein the first end portion of the insert is fastened by soldering to the first face of the drive circuit.

* * * * *